US012796333B2

(12) United States Patent
Kobayashi et al.

(10) Patent No.: US 12,796,333 B2
(45) Date of Patent: Nov. 10, 2026

(54) PIEZOELECTRIC ELEMENT AND MANUFACTURING METHOD FOR PIEZOELECTRIC ELEMENT

(71) Applicant: FUJIFILM CORPORATION, Tokyo (JP)

(72) Inventors: Hiroyuki Kobayashi, Kanagawa (JP); Seigo Nakamura, Kanagawa (JP); Fumihiko Mochizuki, Kanagawa (JP); Hideaki Tanaka, Kanagawa (JP); Kenichiro Inoue, Kanagawa (JP); Yasushi Toyoshima, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 622 days.

(21) Appl. No.: 18/472,168

(22) Filed: Sep. 21, 2023

(65) Prior Publication Data

US 2024/0023454 A1 Jan. 18, 2024

Related U.S. Application Data

(63) Continuation of application No. PCT/JP2022/010719, filed on Mar. 10, 2022.

(30) Foreign Application Priority Data

Mar. 30, 2021 (JP) ................................. 2021-058185

(51) Int. Cl.
*H10N 30/87* (2023.01)
*C23C 14/08* (2006.01)
(Continued)

(52) U.S. Cl.
CPC ........... *H10N 30/878* (2023.02); *C23C 14/08* (2013.01); *C23C 14/34* (2013.01); *H10N 30/06* (2023.02); *H10N 30/8554* (2023.02)

(58) Field of Classification Search
CPC . H10N 30/875; H10N 30/8554; H10N 30/853
See application file for complete search history.

(56) References Cited

U.S. PATENT DOCUMENTS

2010/0194245 A1 8/2010 Harigai et al.
2010/0239952 A1* 9/2010 Ito ......................... C23C 16/409 429/495

(Continued)

FOREIGN PATENT DOCUMENTS

JP 2010-235402 A 10/2010
JP 2013-197496 A 9/2013

(Continued)

OTHER PUBLICATIONS

Sedat, Pala et al., "Fully Transparent Piezoelectric Ultrasonic Transducer with 3D Printed Substrate", 2019 20th International Conference on Solid-State Sensors, Actuators and Microsystems & Eurosensors XXXIII (Transducers & Eurosensors XXXIII), IEEE, Jun. 23, 2019, Berlin, Germanay pp. 234-237, XP033600013, [retrieved on Aug. 20, 2019].

(Continued)

*Primary Examiner* — Bryan P Gordon
(74) *Attorney, Agent, or Firm* — SOLARIS Intellectual Property Group, PLLC

(57) ABSTRACT

In a piezoelectric element including, on a substrate in the following order, a lower electrode layer, a piezoelectric film, and an upper electrode layer, the upper electrode layer includes an oxide conductive layer, has an interface layer containing a constituent element of the oxide conductive layer and an OH group, between the piezoelectric film and the oxide conductive layer of the upper electrode layer, where the interface layer has an amorphous structure and has a thickness of 1 nm or more and 5 nm or less, and in a case where a peak intensity of binding energy derived from a 1s orbital of oxygen bonded to a metal is denoted as α, and a (Continued)

peak intensity of binding energy derived from a 1s orbital of oxygen constituting the OH group is denoted as γ, a peak intensity ratio γ/α is 0.35 or more.

11 Claims, 6 Drawing Sheets

(51) Int. Cl.

| | |
|---|---|
| ***C23C 14/34*** | (2006.01) |
| ***H10N 30/06*** | (2023.01) |
| ***H10N 30/853*** | (2023.01) |

(56) References Cited

U.S. PATENT DOCUMENTS

| | | | |
|---|---|---|---|
| 2011/0143146 A1 | 6/2011 | Harigai et al. | |
| 2011/0177235 A1 | 7/2011 | Fujii et al. | |
| 2012/0038714 A1* | 2/2012 | Harigai | H10N 30/076<br>73/504.12 |
| 2013/0249354 A1 | 9/2013 | Watanabe et al. | |
| 2013/0300254 A1 | 11/2013 | Fujii et al. | |
| 2019/0084306 A1* | 3/2019 | Morozumi | B41J 2/14233 |

FOREIGN PATENT DOCUMENTS

| | | |
|---|---|---|
| JP | 2013-197553 A | 9/2013 |
| JP | 2019-052348 A | 4/2019 |
| JP | 2020-092228 A | 6/2020 |
| JP | 2020-204083 A | 12/2020 |

OTHER PUBLICATIONS

Extended European Search Report dated Aug. 12, 2024, issued in corresponding EP Patent Application No. 22779937.6.

International Search Report issued in International Application No. PCT/JP2022/010719 on May 24, 2022.

Written Opinion of the ISA issued in International Application No. PCT/JP2022/010719 on May 24, 2022.

* cited by examiner

PIEZOELECTRIC ELEMENT AND MANUFACTURING METHOD FOR PIEZOELECTRIC ELEMENT

CROSS-REFERENCE TO RELATED APPLICATIONS

This application is a continuation of International Application No. PCT/JP2022/010719, filed on Mar. 10, 2022, which claims priority from Japanese Patent Application No. 2021-058185, filed on Mar. 30, 2021. The entire disclosure of each of the above applications is incorporated herein by reference.

BACKGROUND

1. Technical Field

The present disclosure relates to a piezoelectric element and a manufacturing method for a piezoelectric element.

2. Related Art

As a material having excellent piezoelectricity and excellent ferroelectricity, there is known lead zirconate titanate ($Pb(Zr, Ti)O_3$, hereinafter referred to as PZT). The PZT is used in a ferroelectric random access memory (FeRAM) which is a non-volatile memory, by taking advantage of the ferroelectricity thereof. Furthermore, in recent years, a MEMS piezoelectric element including a PZT film has been put into practical use by fusing with micro electro-mechanical systems (MEMS) technology. A PZT film is applied as a piezoelectric film in a piezoelectric element having a lower electrode, a piezoelectric film, and an upper electrode on a substrate. This piezoelectric element has been developed into various devices such as, an inkjet head (an actuator), a micromirror device, an angular velocity sensor, a gyro sensor, and an oscillation power generation device.

In a case where the piezoelectric element is applied to a device, it is desirable that the piezoelectric characteristics are higher since the device performance is higher as the piezoelectric characteristics are higher. So far, various studies have been carried out on the improvement of the piezoelectric characteristics of the piezoelectric film, and the piezoelectric characteristics peculiar to the piezoelectric material have been improved. Therefore, it is conceived that it is difficult to further improve dramatically the piezoelectric characteristics peculiar to the piezoelectric material. On the other hand, the piezoelectric characteristics as the piezoelectric element is indicated as the product of the piezoelectric characteristics peculiar to the piezoelectric material and the applied voltage. That is, in a case where the piezoelectric characteristics of the piezoelectric films are the same, it can be said that an element capable of applying a higher voltage has higher performance as an actuator. As a result, there is a demand for the realization of a piezoelectric element having a dielectric breakdown voltage (hereinafter, referred to as a withstand voltage) higher than those in the related art.

As a method of improving the withstand voltage of the piezoelectric element, for example, JP2020-204083A and JP2010-235402A propose a method of improving the crystallinity of a piezoelectric film to improve the withstand voltage of the piezoelectric film by adding an additive that promotes sintering of a piezoelectric material that is a main component for forming a PZT film or an additive that adjusts charge balance. Similarly, JP2019-052348A proposes a method of improving the crystallinity of a piezoelectric film to improve the withstand voltage of the piezoelectric film itself by providing a buffer layer (also referred to as a seed layer) on a surface on which a film of a piezoelectric film is formed.

SUMMARY

In JP2020-204083A and JP2010-235402A, the withstand voltage is improved by adding an additive to the piezoelectric film. However, the introduction of the additive causes a problem in that piezoelectric characteristics other than the withstand voltage, particularly the piezoelectric constant decreases.

JP2019-052348A provides a seed layer to improve the crystallinity of the PZT film, thereby improving the withstand voltage. However, since a new layer called a seed layer is introduced, there is a problem that the process load is large.

The technology of the present disclosure has been made in consideration of the above circumstances, and an object of the present disclosure is to provide a piezoelectric element and a manufacturing method for a piezoelectric element, which realizes high withstand voltage and drive stability without deteriorating piezoelectric characteristics.

Specific means for solving the above problems include the following aspects.

The piezoelectric element according to the present disclosure is a piezoelectric element including, on a substrate in the following order, a lower electrode layer, a piezoelectric film containing a perovskite-type oxide as a main component, and an upper electrode layer, in which at least a region of the upper electrode layer closest to a side of the piezoelectric film is composed of an oxide conductive layer, an interface layer containing a constituent element of the oxide conductive layer and an OH group is provided between the piezoelectric film and the oxide conductive layer of the upper electrode layer, the interface layer has an amorphous structure and has a thickness of 1 nm or more and 5 nm or less, and in an intensity profile of binding energy in the interface layer, which is acquired by an X-ray photoelectron spectroscopy measurement, in a case where a peak intensity of binding energy derived from a 1s orbital of oxygen bonded to a metal is defined as $\alpha$, and a peak intensity of binding energy derived from a 1s orbital of oxygen constituting the OH group is defined as $\gamma$, a peak intensity ratio $\gamma/\alpha$ satisfies Expression (1).

$$0.35 \le \gamma/\alpha \quad (1)$$

In the piezoelectric element according to the present disclosure, the oxide conductive layer is a layer containing indium tin oxide (ITO), iridium oxide ($IrO_2$), or strontium ruthenium oxide ($SrRuO_3$) as a main component. The "main component" means a component that accounts for 50% by mole or more of the components constituting a film or a layer.

In the piezoelectric element according to the present disclosure, it is preferable that in the intensity profile of the binding energy, the peak intensity ratio $\gamma/\alpha$ satisfies Expression (2).

$$0.55 \le \gamma/\alpha \quad (2)$$

In the piezoelectric element according to the present disclosure, it is preferable that the interface layer has a thickness of 3 nm or more and 5 nm or less.

In the piezoelectric element according to the present disclosure, it is preferable that a height difference of a surface unevenness of the piezoelectric layer is 100 nm or less.

In the piezoelectric element of the present disclosure, it is preferable that the perovskite-type oxide contains lead (Pb), zirconium (Zr), titanium (Ti), and O (oxygen).

In the piezoelectric element according to the present disclosure, it is preferable that the perovskite-type oxide is a compound represented by General Formula (3), $$Pb\{(Zr_xTi_{1-x})_{y-1}B1_y\}O_3 \quad (3)$$

$0<x<1$, $0<y<0.3$, where B1 is one or more elements selected from vanadium (V), niobium (Nb), tantalum (Ta), Sb (antimony), molybdenum (Mo), and tungsten (W).

In the piezoelectric element according to the present disclosure, it is preferable that the piezoelectric film is an alignment film having a (100) plane alignment.

In the piezoelectric element according to the present disclosure, it is preferable that in a case where the piezoelectric film is an alignment film having a (100) plane alignment, the (100) plane has an inclination of 1° or more with respect to the film surface.

A manufacturing method for a piezoelectric element according to the present disclosure includes a sputtering step of forming a film of the oxide conductive layer on the piezoelectric film of a laminate including the lower electrode layer and the piezoelectric film on the substrate, where in an initial stage of the film formation in the sputtering step, sputtering is carried out, while introducing an $H_2O$ gas into a film forming chamber of a film forming device, to form the interface layer, and subsequently, sputtering is carried out in a state where the introduction of the $H_2O$ gas is stopped, to form the film of the oxide conductive layer.

A manufacturing method for a piezoelectric element according to the present disclosure includes a sputtering step of forming a film of the oxide conductive layer on the piezoelectric film of a laminate including the lower electrode layer and the piezoelectric film on the substrate, where before carrying out the sputtering step, vacuuming is carried out until a back pressure in a film forming chamber of a film forming device reaches $5\times10^{-3}$ Pa or more and $5\times10^{-2}$ Pa or less, and after the back pressure is reached, a film forming gas is introduced to carry out the sputtering step.

According to the piezoelectric element and the manufacturing method for a piezoelectric element according to the present disclosure, it is possible to obtain a piezoelectric element that realizes a high withstand voltage without deteriorating the piezoelectric characteristics of the piezoelectric film.

DESCRIPTION OF EMBODIMENTS

Figure 1:
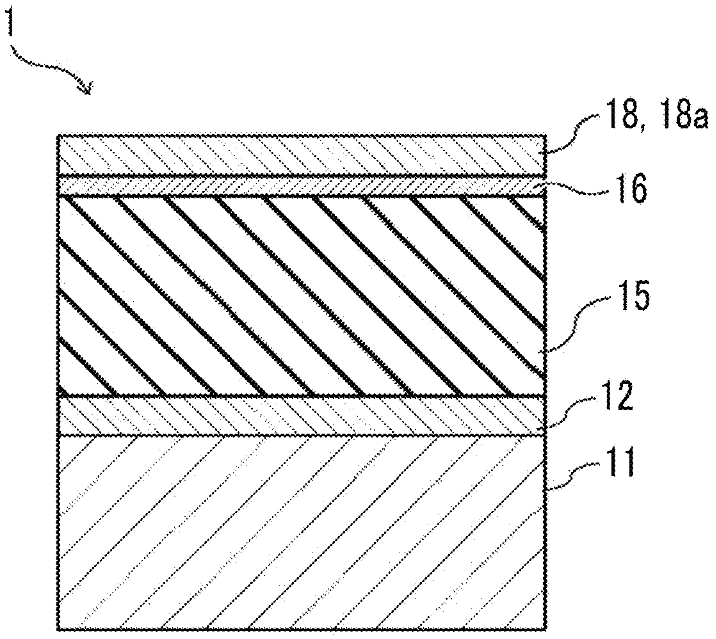
FIG. 1 is a cross-sectional view showing a layer configuration of a piezoelectric element according to one embodiment.

Hereinafter, embodiments according to the present invention will be described with reference to the drawings. In the drawings below, the layer thickness of each of the layers and the ratio therebetween are appropriately changed and drawn for easy visibility, and thus they do not necessarily reflect the actual layer thickness and ratio.

(Piezoelectric Element)

FIG. 1 is a schematic cross-sectional view showing a layer configuration of a piezoelectric element 1 according to one embodiment. As shown in FIG. 1, a piezoelectric element 1 includes, on a substrate 11, a lower electrode layer 12, a piezoelectric film 15, and an upper electrode layer 18 in this order. In addition, the piezoelectric element 1 includes an interface layer 16 between the piezoelectric film 15 and the upper electrode layer 18.

In the upper electrode layer 18, at least a region closest to a side of the piezoelectric film is composed of an oxide conductive layer 18*a*. The oxide conductive layer 18*a* constituting the region of the upper electrode layer 18 closest to the side of the piezoelectric film is preferably a layer containing ITO, $IrO_2$, or $SrRuO_3$ as a main component. It is noted that although the stoichiometric composition of iridium oxide is $IrO_2$, the iridium oxide to be applied to the oxide conductive layer 18*a* may be $IrO_x$ ($x<2$), which is oxygen-deficient as compared with the stoichiometric composition. The present embodiment shows an example in which the upper electrode layer 18 has a single layer structure and consists of the oxide conductive layer 18*a*. It is noted that the oxide conductive layer 18*a* is preferably a layer in which ITO, $IrO_2$, or $SrRuO_3$ accounts for 80% by mole or more. It is noted that the upper electrode layer 18 may have a laminated structure instead of a single layer structure, and in a case where a laminated structure is provided, it is sufficient that the oxide conductive layer is disposed closest to the side of the piezoelectric film. In addition, in a case where the upper electrode layer 18 has a laminated structure, a metal layer may be included.

As described above, the interface layer 16 is formed between the piezoelectric film 15 and the upper electrode layer 18. Since the region of the upper electrode layer 18 closest to the side of the piezoelectric film 15 is composed of the oxide conductive layer, the interface layer 16 is formed between the piezoelectric film 15 and the oxide conductive layer 18*a*. In addition, the interface layer 16 contains at least a constituent element of the oxide conductive layer 18*a* constituting the upper electrode layer 18 and an OH group. In addition, the interface layer 16 has an amorphous structure and has a thickness of 1 nm or more and 5 nm or less. The thickness of the interface layer 16 is more preferably 3 nm or more and 4 nm or less.

In this interface layer 16, in the intensity profile of binding energy in the interface layer 16, which is acquired by an X-ray photoelectron spectroscopy measurement, a peak intensity ratio $\gamma/\alpha$ of an intensity $\gamma$ of binding energy derived from a 1s orbital of oxygen constituting the OH group to an intensity $\alpha$ of binding energy derived from a 1s orbital of oxygen bonded to a metal satisfies Expression (1).

$$0.35\leq\gamma/\alpha \quad (1)$$

It is noted that although the details of the measuring method for the intensity profile of the binding energy will be described later in Examples, α and γ shall be determined as follows. The interface layer 16 is subjected to a photoelectron spectroscopy measurement to acquire an intensity profile in which the vertical axis indicates intensity and the lateral axis indicates binding energy. In this case, as the intensity profile, a spectrum derived from the 1s (O1s) orbital of the oxygen appearing in the vicinity of 530 eV is acquired. The spectrum derived from the O1s orbital observed in the vicinity of 530 eV includes a peak derived from oxygen bonded to a metal M and a peak derived from oxygen constituting an OH group (that is, oxygen bonded to hydrogen). The peak of the 1s orbital of oxygen bonded to hydrogen is generated on the high energy side with respect to the peak of the 1s orbital of oxygen bonded to the metal M. Therefore, the spectrum of the O1s orbital is separated into two peaks, a peak on the high energy side is defined as the peak of binding energy derived from the 1s orbital of the oxygen of the OH group, and a peak intensity thereof is defined as γ. In addition, a peak on the low energy side is defined as the peak of binding energy derived from the 1s orbital of the oxygen bonded to the metal M, and a peak intensity thereof is defined as α. Here, the peak intensity ratio γ/α is calculated from α and γ obtained in this way.

Here, the metal M includes all the metals contained in the interface layer 16. For example, in a case where the oxide conductive layer **18*a* is an ITO layer, the metal M contains at least In and Sn and may further contain the metal as the constituent element of the piezoelectric film. Since the binding energy derived from the 1s orbital of the oxygen bonded to the metal hardly depends on the metal species bonded to the metal, it is treated as one peak even in a case where the metal species is bonded to any metal. Similarly, since the binding energy derived from the 1s orbital of the oxygen in the OH group also hardly depends on the metal species bonded to the OH group, it is treated as one peak. It is noted that the OH group is conceived to be present as a metal hydroxide in the interface layer 16**.

The inventors of the present inventions have found that the withstand voltage and the drive stability of the piezoelectric element 1 can be improved by having the configuration of the piezoelectric element described above (see Examples described later). As described above, In a case of providing the oxide conductive layer **18*a* in a region of the upper electrode layer 18 closest to the side of the piezoelectric film 15, oxygen elements are less likely to come out from the piezoelectric film 15 as compared with a case where the region closest to the side closest to the piezoelectric film 15 is a metal, and an effect of suppressing a decrease in piezoelectricity can be obtained. On the other hand, in a case of forming a film of the oxide conductive layer 18*a* in the upper electrode layer 18 on the piezoelectric film 15 by a sputtering method, it is easy to form the interface layer 16 including an OH group at the interface between the piezoelectric film 15 and the upper electrode layer 18. Although the details of the manufacturing method for a piezoelectric element will be described later, each layer of the present piezoelectric element is formed into a film by a sputtering method. In general, it is conceived not to be preferable that an OH group is contained in an electronic device including a piezoelectric element since the deterioration thereof easily occurs. In particular, in a case of forming a film of an oxide, water is easily taken in. Therefore, in a case where each layer of the piezoelectric element 1 is formed into a film by a sputtering method, it is conceived to be preferable that the film formation is carried out after the back pressure in the film forming chamber of the film forming device is sufficiently reduced so that an OH group is not mixed in each layer, and the moisture contained in the inside of the film forming chamber is sufficiently removed. However, the inventors of the present invention found that contrary to general knowledge, in a case of including the interface layer 16 containing an OH group to some extent or more at an interface between the piezoelectric film 15 and the oxide conductive layer 18*a*, the withstand voltage and the drive stability of the piezoelectric element 1** can be improved.

It is noted that in the above-described intensity profile of the binding energy, the peak intensity ratio γ/α more preferably satisfies Expression (2).

$$0.55 \leq \gamma/\alpha \qquad (2)$$

Further, in a case where the interface layer 16 satisfying Expression (2) is provided, it is possible to obtain higher withstand voltage and higher drive stability.

In addition, $\gamma/\alpha \leq 0.9$ is preferable, and $\gamma/\alpha \leq 0.8$ is more preferable. In a case of $\gamma/\alpha \leq 0.8$, the production is easy, and the effect of improving the withstand voltage is high. In addition, $\gamma/\alpha \leq 0.8$ is also preferable from the viewpoint of suppressing the increase in the resistance of the interface layer 16.

In addition, the thickness of the interface layer 16 is preferably 3 nm or more and 5 nm or less. In a case of setting the thickness of the interface layer 16 within this range, higher withstand voltage and higher drive stability can be obtained (see Examples).

In a case where the oxide conductive layer **18*a*** is a layer containing ITO as a main component, $0.4 \leq \gamma/\alpha \leq 0.8$ is preferable, and $0.55 \leq \gamma/\alpha \leq 0.8$ is more preferable.

In a case where the oxide conductive layer **18*a*** is a layer containing $IrO_2$ as a main component, $0.4 \leq \gamma/\alpha \leq 0.65$ is preferable.

In a case where the oxide conductive layer **18*a*** is a layer containing $SrRuO_3$ as a main component, $0.35 \leq \gamma/\alpha \leq 0.70$ is preferable.

The piezoelectric film 15 contains, as a main component, a perovskite-type oxide represented by the general formula $ABO_3$.

In the general formula, A is an A site element, which is one of Pb, barium (Ba), lanthanum (La), Sr, bismuth (Bi), lithium (Li), sodium (Na), calcium (Ca), cadmium (Cd), magnesium (Mg), or potassium (K), or a combination of two or more thereof.

In the general formula, B is a B site element, which is one of Ti, Zr, vanadium (V), Nb (niobium), tantalum (Ta), chromium (Cr), molybdenum (Mo), tungsten (W), manganese (Mn), iron (Fe), Ru, cobalt (Co), Ir, nickel (Ni), copper (Cu), zinc (Zn), gallium (Ga), In, tin, antimony (Sb), or a lanthanide element, or a combination of two or more thereof.

In the general formula, O is oxygen.

Regarding A:B:O, a reference ratio is 1:1:3; however, the ratio may deviate within a range in which a perovskite structure is obtained.

It is noted that the piezoelectric film 15 is preferably occupied by 80% by mole or more of the perovskite-type oxide. Further, it is preferable that the piezoelectric film 15 consists of a perovskite-type oxide (however, it contains unavoidable impurities).

The perovskite-type oxide is preferably a lead zirconate titanate (PZT) type that contains lead (Pb), zirconium (Zr), titanium (Ti), and oxygen (O).

In particular, it is preferable that the perovskite-type oxide is a compound represented by General Formula (3), which contains an additive B in the B site of PZT.

$$Pb\{(Zr_xTi_{1-x})_{1-y}B1_y\}O_3 \quad (3)$$

Here, B1 is preferably one or more elements selected from vanadium (V), niobium (Nb), tantalum (Ta), antimony (Sb), molybdenum (Mo), and tungsten (W). Here, $0<x<1$ and $0<y<0.3$ are satisfied. It is noted that regarding $Pb:\{(Zr_xTi_{1-x})_{1-y}B_y\}:O$ in General Formula (3), a reference ratio thereof is 1:1:3; however, the ratio may deviate within a range in which a perovskite structure is obtained.

B1 may be a single element such as V only or Nb only, or it may be a combination of two or three or more elements, such as a mixture of V and Nb or a mixture of V, Nb, and Ta. In a case where B1 is these elements, a very high piezoelectric constant can be realized in combination with Pb of the A site element.

Figure 2:
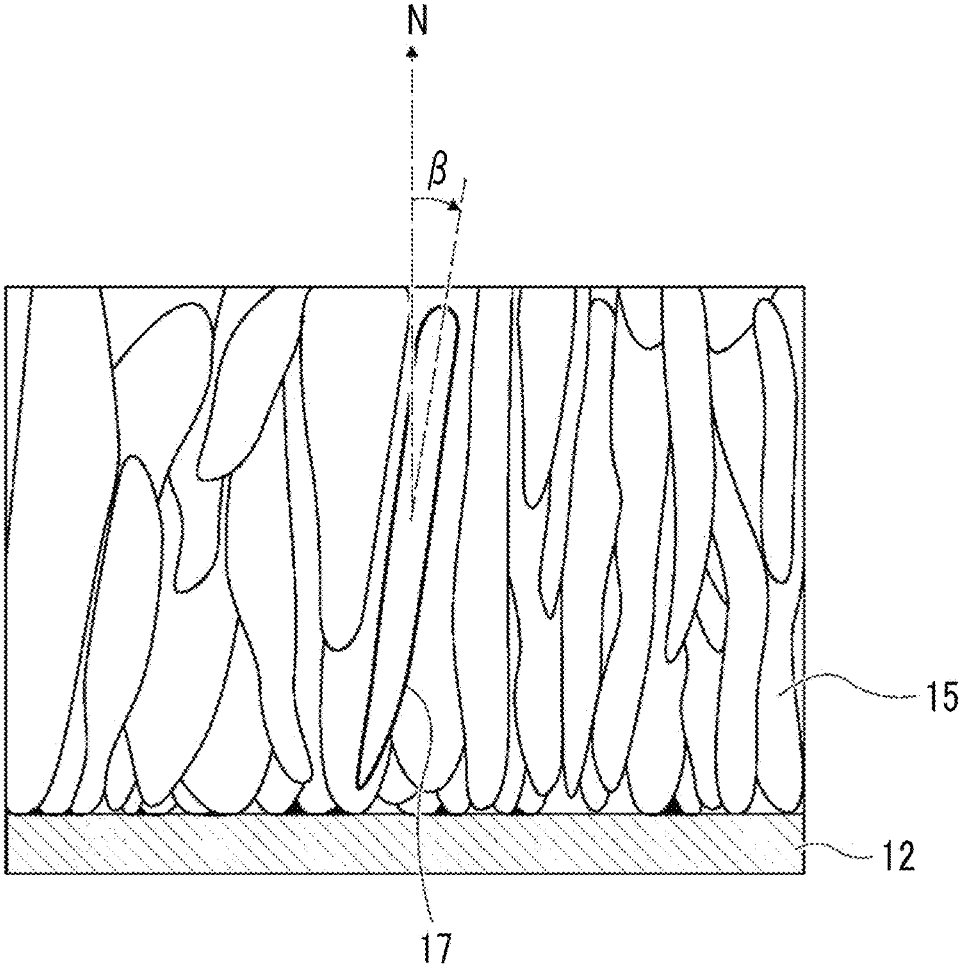
FIG. 2 is an enlarged schematic view of a piezoelectric film.

As shown in the schematic cross-sectional view of FIG. 2, the piezoelectric film 15 is preferably a columnar structure film having a columnar structure containing a large number of columnar crystal bodies 17. It is preferable that a large number of columnar crystal bodies 17 are uniaxial alignment films that extend non-parallelly with respect to the surface of the substrate 11 (see FIG. 1) and have the same crystal orientation. In a case of adopting an alignment structure, it is possible to obtain larger piezoelectricity.

Further, in the example shown in FIG. 2, the longitudinal direction of the columnar crystal has an inclination β of 1° or more with respect to the normal line of the substrate. This means that the alignment plane of the piezoelectric film 15 has an inclination of 1° or more with respect to the surface of the substrate. Here, the alignment plane is a (100) plane or a (001) plane. As described above, it is preferable that in the piezoelectric film 15, the (100) plane or (001) plane of the columnar crystals is inclined by 1° or more with respect to the surface of the substrate. In the present example, the lattice constants on the a-axis and the c-axis in the perovskite structure are substantially the same, and thus it is not possible to distinguish the (100) plane from the (001) plane in the analysis by X-ray diffraction (XRD). However, it can be confirmed by XRD analysis that the alignment film is aligned in any one of the planes.

The thickness of the piezoelectric film 15 is generally 200 nm or more, and it is, for example, 0.2 μm to 5 μm. However, it is preferably 1 μm or more.

The height difference of the surface unevenness of the piezoelectric film 15 is preferably 100 nm or less. The method of measuring the surface unevenness will be described in Examples described later: however, the height difference of the surface unevenness shall be the peak to valley (the PV value), which is the maximum unevenness difference. Here, the cycle of the surface unevenness is not a fine cycle such as in several tens of nm to several hundred nm, but a cycle having an order in terms of m.

In a case where the PV value of the surface unevenness of the piezoelectric film 15 is 100 nm or less, it is possible to coat the piezoelectric film 15 with the extremely thin interface layer 16, and it is possible to obtain a high effect due to including the interface layer 16. That is, in a case where the PV value of the surface unevenness of the piezoelectric film 15 is 100 nm or less, the effect of improving the withstand voltage of the piezoelectric element and the effect of improving the drive stability can be enhanced. The PV value of the surface unevenness of the piezoelectric film 15 is more preferably 80 nm or less.

The height difference of the surface unevenness can be measured in a dynamic force mode (DFM) using a scanning probe microscope (SPM). In a case where the upper electrode layer 18 having a pattern formed on the piezoelectric film 15 is formed, the height difference of the surface unevenness can be measured on the surface of the piezoelectric film 15 where the upper electrode layer 18 is not formed and is exposed. Alternatively, the measurement can be carried out on the surface of the piezoelectric film 15 before the formation of the upper electrode layer 18.

The substrate 11 is not particularly limited, and examples thereof include substrates such as silicon, glass, stainless steel, yttrium-stabilized zirconia, alumina, sapphire, and silicon carbide. As the substrate 11, a laminated substrate such as a thermal oxide film-attached silicon substrate having a $SiO_2$ oxide film formed on the surface of the silicon substrate, may be used.

The lower electrode layer 12 is paired with the upper electrode layer 18 and is an electrode for applying a voltage to the piezoelectric film 15. The main component of the lower electrode layer 12 is not particularly limited, and examples thereof include metals such as gold (Au), platinum (Pt), iridium (Ir), ruthenium (Ru), Ti, Mo, Ta, aluminum (Al), copper (Cu), and silver (Ag), and metal oxides thereof, as well as combinations thereof. In addition, indium tin oxide (ITO), $LaNiO_3$, $SrRuO_3$ (SRO), or the like may be used. Various intimate attachment layers or seed layers may be included between the piezoelectric film 15 and the lower electrode layer 12 and between the lower electrode layer 12 and the substrate 11.

Here, "lower" and "upper" do not respectively mean top and bottom in the vertical direction. As a result, an electrode disposed on the side of the substrate with the piezoelectric film being interposed is merely referred to as the lower electrode, and an electrode disposed on the side of the piezoelectric film opposite to the substrate is merely referred to as the upper electrode.

The layer thicknesses of the lower electrode layer 12 and the upper electrode layer 18 are not particularly limited, and they are preferably about 50 nm to 300 nm and more preferably 100 nm to 300 nm.

(Manufacturing Method for Piezoelectric Element)

An embodiment of a manufacturing method for the piezoelectric element 1 will be described.

The lower electrode layer 12 and the piezoelectric film 15 are sequentially subjected to film formation on the substrate 11 by a sputtering method. Next, the upper electrode layer 18 is subjected to film formation on the piezoelectric film 15. The film forming step of the upper electrode layer 18, first, includes a sputtering step of forming a film of the oxide conductive layer **18*a* on the piezoelectric film 15 of a laminate including the lower electrode layer 12 and the piezoelectric film 15 on the substrate 11**.

In the initial stage of the film formation in the sputtering step of forming the film of the oxide conductive layer **18*a*, the interface layer 16 is formed between the piezoelectric film 15 and the oxide conductive layer 18*a*. Specifically, in the initial stage of the film formation in the sputtering step of forming the oxide conductive layer 18*a*, sputtering is carried out while introducing an $H_2O$ gas (that is, water vapor) into a film forming chamber of the film forming device, whereby the interface layer 16 is formed. Thereafter, sputtering is carried out in a state where the introduction of the $H_2O$ gas into the film forming chamber is stopped, to form the film of the oxide conductive layer 18*a*. The initial stage of the film formation in the sputtering step of forming the film of the oxide conductive layer 18*a* on the piezoelectric film 15 refers to a period from a moment when a target for forming the film of the oxide conductive layer 18*a* is set in a target holder in the film forming chamber and sputtering is started, until the formation of the interface layer 16. The amount of the $H_2O$ gas to be introduced and the time for the initial stage of film formation may be set depending on the thickness of the interface layer 16** and the desired amount of the OH group to be added.

According to the above-described manufacturing method, it is possible to obtain the piezoelectric element 1 including the interface layer 16 having an amorphous structure, having a thickness of 1 to 5 nm, and containing an OH group, where the interface layer 16 is an interface layer satisfying the following conditions. In the intensity profile of binding energy in the interface layer 16, which is acquired by an X-ray photoelectron spectroscopy measurement, a peak intensity ratio $\gamma/\alpha$ of an intensity $\gamma$ of binding energy derived from a is orbital of oxygen constituting the OH group to an intensity $\alpha$ of binding energy derived from a 1s orbital of oxygen bonded to a metal satisfies Expression (1).

$$0.35\leq\gamma/\alpha \quad (1)$$

It is noted that A method of introducing water vapor into a film forming chamber of a film forming device includes a method of introducing a mixed gas of $H_2$+$O_2$ into a film forming chamber to generate $H_2O$ in plasma, a method of supplying water vapor from the outside, and the like. On the other hand, a method of forming the interface layer 16 including an OH group includes a method of utilizing a residual gas in the film forming chamber, in addition to introducing water vapor into the film forming chamber from the outside at the initial stage of the film formation in the sputtering step of forming the oxide conductive layer, as described above.

As a modification example of the manufacturing method for the piezoelectric element 1, a method of utilizing a residual gas in the film forming chamber will be described.

In a modification example of the manufacturing method for the piezoelectric element 1, before carrying out the sputtering step of forming the film of the oxide conductive layer 18*a* on the piezoelectric film 15, vacuuming is carried out until a back pressure in a film forming chamber reaches $5\times10^{-3}$ Pa or more and $5\times10^{-2}$ Pa or less, and after vacuuming has been carried out until the back pressure has reached, a film forming gas is introduced to carry out the sputtering step. According to this method, it is possible to form, between the piezoelectric film 15 and the oxide conductive layer 18*a*, the piezoelectric element 1 including the interface layer 16 having an amorphous structure, having a thickness of 1 to 5 nm, and containing an OH group, where the interface layer 16 is an interface layer satisfying the above-described conditions.

In the film forming chamber of the film forming device for carrying out sputtering, in order to suppress the incorporation of components contained in the residual gas in the film forming chamber, into the film as impurities, vacuuming is carried out in the film forming chamber before filling the inside of the film forming chamber with a film forming gas. The pressure in the chamber where this vacuuming has been carried out is referred to as back pressure. The lower the internal pressure is due to vacuuming in the film forming chamber, that is, the lower the back pressure is, the more residual gas can be reduced. The residual main component in the film forming chamber is water. In order to suppress the adhesion of water to the surface of the oxide such as the piezoelectric film 15, in the related art, vacuuming was carried out so that the back pressure was sufficiently low in a case of forming a film of the upper electrode layer 18 on the piezoelectric film 15. Specifically, the vacuuming was carried out so that the back pressure was about $2\times10^{4}$ Pa. On the other hand, in the modification example of the manufacturing method for the piezoelectric element according to the present disclosure, the back pressure is set to $5\times10^{-3}$ Pa or more and $5\times10^{-2}$ Pa or less, which is higher than those in the related art. As a result, the amount of the residual gas is increased as compared with those in the related art, whereby an environment in which water easily adheres to the surface of the piezoelectric film 15 is created, which makes it possible to form the interface layer 16 containing a large number of OH groups as compared with those in the related art.

It is noted that in order to form the interface layer 16 between the piezoelectric film 15 and the oxide conductive layer 18*a*, the back pressure in the film forming chamber may be set to $5\times10^{-3}$ Pa or more and $5\times10^{-2}$ Pa or less before the sputtering step of forming the film of the oxide conductive layer 18*a* on the piezoelectric film 15, and further, the $H_2O$ gas may be introduced into the film forming chamber in the initial stage of the film formation in the sputtering step of forming the film of the oxide conductive layer 18*a*.

EXAMPLES

Hereinafter, Examples and Comparative Examples according to the present disclosure will be described.

First, a manufacturing method for a piezoelectric element of each of Examples and Comparative Examples will be described. The description of the manufacturing method will be made with reference to the reference numerals of the respective layers of the piezoelectric element 1 shown in FIG. 1.

(Formation of Film of Lower Electrode Layer)

As the substrate 11, a thermal oxide film-attached silicon substrate having a size of 8 inches was used. The lower electrode layer 12 was formed into a film on the substrate 11 by radio-frequency (RF) sputtering. Specifically, as the lower electrode layer 12, a Ti layer having a thickness of 20 nm and Ir layer having a thickness of 150 nm were laminated on the substrate 11 in this order. The sputtering conditions for each layer were as follows.

—Sputtering Conditions for Ti Layer—

Distance between target and substrate: 100 mm
Target input power: 600 W
Ar gas pressure: 0.2 Pa
Substrate set temperature: 350° C.

—Sputtering Conditions for Ir Layer—

Distance between target and substrate: 100 mm
Target input power: 600 W
Ar gas pressure: 0.2 Pa
Substrate set temperature: 350° C.

(Formation of Piezoelectric Film)

The substrate with the lower electrode layer was placed in an RF sputtering apparatus, and an Nb-doped PZT film of 2 μm was formed, where the Nb-doping amount to the B site was set to 10 at %. The sputtering conditions in this case were as follows.

—Sputtering Conditions for Piezoelectric Film—

Distance between target and substrate: 60 mm
Target input power: 500 W
Vacuum degree: 0.3 Pa, an Ar/$O_2$ mixed atmosphere ($O_2$ volume fraction: 2.0%)
Substrate set temperature: 700° C.

The steps up to the film formation of the piezoelectric film are common to all Examples and Comparative Examples. The following method or film forming condition for forming the upper electrode layer is different between Examples and Comparative Examples.

(Formation of Film of Upper Electrode Layer)

Next, the upper electrode layer 18 having a thickness of 200 nm was formed on the surface of the piezoelectric film 15 by sputtering. For each of Examples and Comparative Examples, the upper electrode layer 18 consisting of the upper electrode layer material shown in Table 1 was formed. It is noted that an ITO target was used in a case where a film of an ITO layer was formed as the upper electrode layer 18, and an $SrRuO_3$ target was used in a case where a film of $SrRuO_3$ layer was formed. On the other hand, in a case where an $IrO_2$ layer was formed into a film as the upper electrode layer 18, an Ir target was used, and reactive sputtering was carried out. It is noted that the interface layer 16 was formed in the initial stage of the film formation of the upper electrode layer 18.

Examples 1 to 4, 8, 10, and Comparative Example 1

A substrate after forming a piezoelectric film was placed in a film forming chamber of an RF sputtering apparatus, each of Examples and Comparative Examples was subjected to vacuuming to the back pressure shown in Table 1, and then an $Ar/O_2$ mixed gas ($O_2$ volume fraction: 10%) was introduced into the apparatus so that the vacuum degree was 0.3 Pa. The substrate set temperature was set to room temperature (RT), and a target input power was set to 200 W.

Comparative Examples 2 and 3

The substrate temperature was set to 200° C. Conditions other than the substrate temperature setting were the same as in Example 1.

Examples 5, 6, 9, and 11

Film formation was carried out while introducing an $H_2O$ gas for 10 seconds at the initial stage of film formation. A target using the material of the upper electrode layer was set, and after 10 seconds from the moment of the start of the sputter film formation, sputtering was carried out while introducing the $H_2O$ gas into the film forming chamber. As a carrier gas for bubbling, Ar was passed through a bottle containing pure water, and an $H_2O$ gas was directly supplied into the film forming chamber using the vapor pressure of water. In this case, the flow rate ratio of the $H_2O$ gas, $H_2O/(H_2O+O_2)$, was adjusted to be 10%.

Example 7

Film formation was carried out while introducing an $H_2O$ gas for 20 seconds at the initial stage of film formation. After 20 seconds, the film formation was carried out in a state where the introduction of the $H_2O$ gas was stopped. Conditions other than the introduction time of the $H_2O$ gas were the same as in Example 5.

Comparative Example 4

Film formation was carried out while introducing an $H_2O$ gas for 30 seconds at the initial stage of film formation. After 30 seconds, the film formation was carried out in a state where the introduction of the $H_2O$ gas was stopped. Conditions other than the introduction time of the $H_2O$ gas were the same as in Example 5.

In the manner as described above, a laminate for cutting out the piezoelectric element of each of Examples or Comparative Examples was produced. The piezoelectric element of each of Examples and Comparative Examples, which had been cut out from the laminate produced in this way, was subjected to the following evaluation and measurement. It is noted that the piezoelectric elements of Example 5 and Example 6 are the same laminate and are elements respectively cut out from a central part and an outer peripheral part of an 8-inch substrate.

<Evaluation of Layer Configuration and Crystallinity>

A scanning transmission electron microscope (STEM) image and a transmission electron microscope (TEM) image were captured to evaluate the layer configuration of the piezoelectric element and the crystallinity of each layer.

Figure 4:
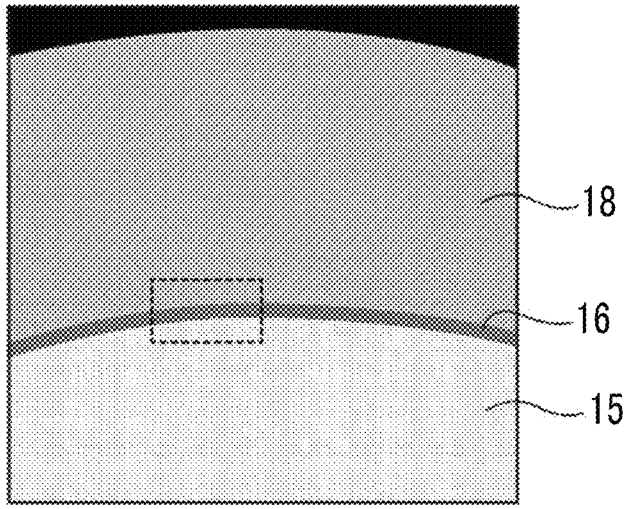
FIG. 4 is a schematic view of an HAADF-STEM image of the piezoelectric element.

FIG. 4 is a view schematically showing a high-angle annular dark field scanning (HAADF)-STEM image of a region with the interface layer 16 as a center in the cross section of the piezoelectric element of Examples and Comparative Examples. As shown in FIG. 4, in the HAADF-STEM image, the contrast due to the composition is clearly observed. For present Examples and Comparative Examples, the presence of the interface layer 16 having a composition different from that of the upper electrode layer 18 and the piezoelectric film 15 was confirmed between the upper electrode layer 18 and the piezoelectric film 15 (see FIG. 4). In addition, a further enlarged TEM image was acquired for the vicinity of the interface layer 16 such as a rectangular region surrounded by a broken line in FIG. 4, and the crystal state was checked (not shown in the drawing). In the ITO layer constituting the upper electrode layer 18, a pattern, in which lines extended in an oblique direction in a direction intersecting the interface layer 16 and the lines extending in the oblique direction were arranged in a stripe shape, was observed. In addition, in the PZT film constituting the piezoelectric film 15, a horizontal stripe pattern, in which lines extended in the lateral direction substantially parallel to the interface layer 16 and the lines extending in the lateral direction was arranged in a lateral stripe pattern (arranged in the direction substantially parallel to the interface layer 16), was observed. It is conceived that the crystal planes are observed in a stripe shape. On the other hand, no regular stripes were observed in the interface layer 16, and thus the interface layer 16 had an amorphous structure. It is noted that in each of Examples and Comparative Examples, the same structure was observed, and there was no significant difference except that the thickness of the interface layer 16 was different.

<Measurement of Thickness of Interface Layer>

For the thickness of the interface layer of each of Examples and Comparative Examples, lines were drawn in a TEM image at the boundary between the piezoelectric film 15 and the interface layer 16 and the boundary between the interface layer 16 and the upper electrode layer 18, and then the distance between the two lines was measured. The thickness of each example is shown in Table 1 below. It is noted that the measured value of the thickness includes an error of about 10%.

<Evaluation of OH Content in Interface Layer>

The OH content in the interface layer was evaluated by the photoelectron spectroscopy measurement of the interface layer.

Figure 5B:
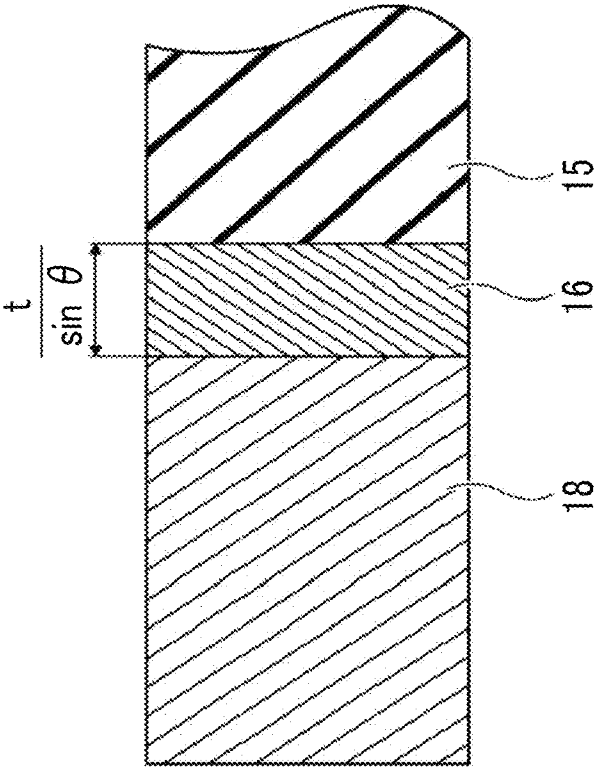
FIGS. 5A and 5B are explanatory views of a production method for a sample for photoelectron spectroscopy.
Figure 5A:
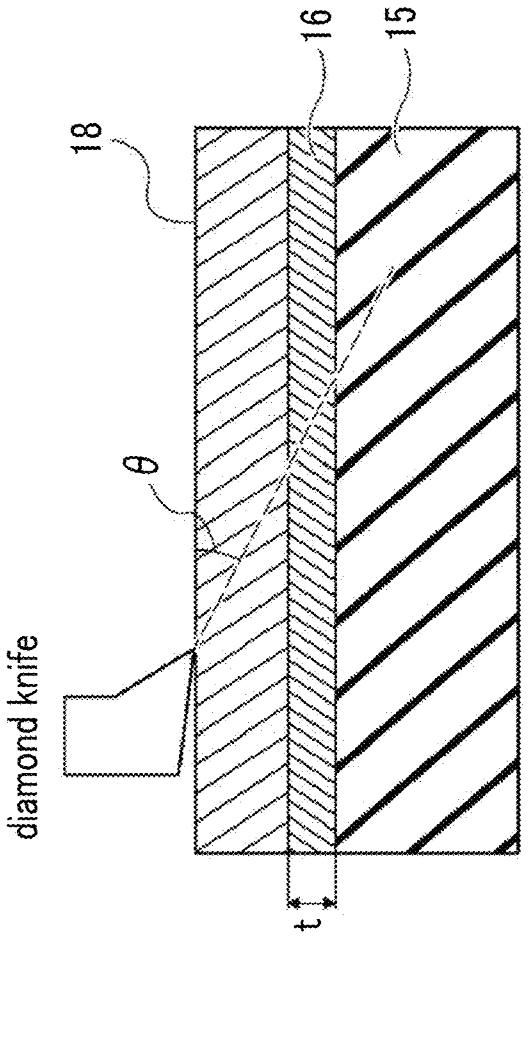
Figure 6:
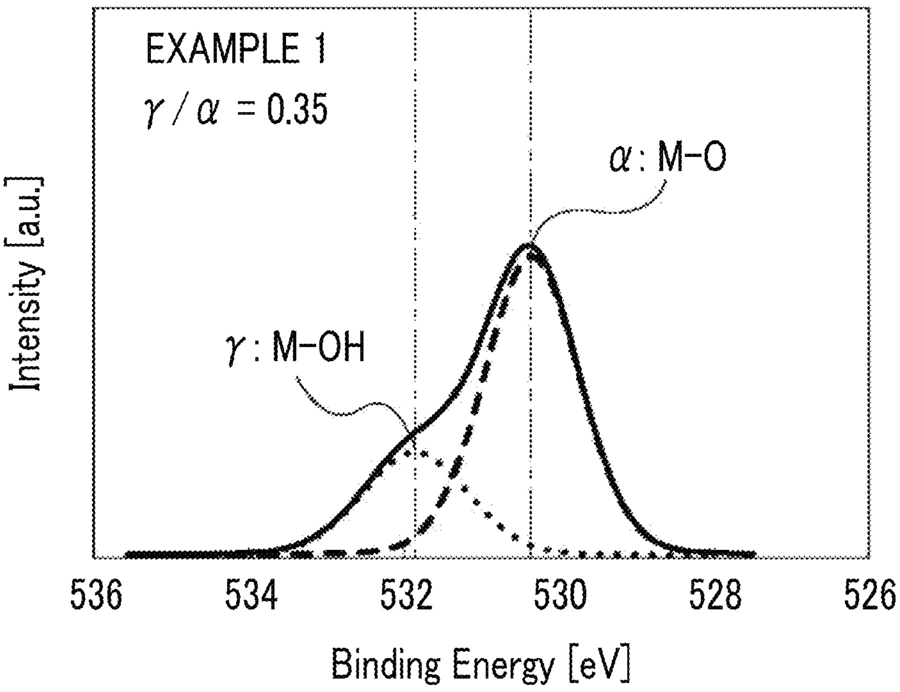
FIG. 6 is a view showing a binding energy profile for an interface layer of Example 1.
Figure 7:
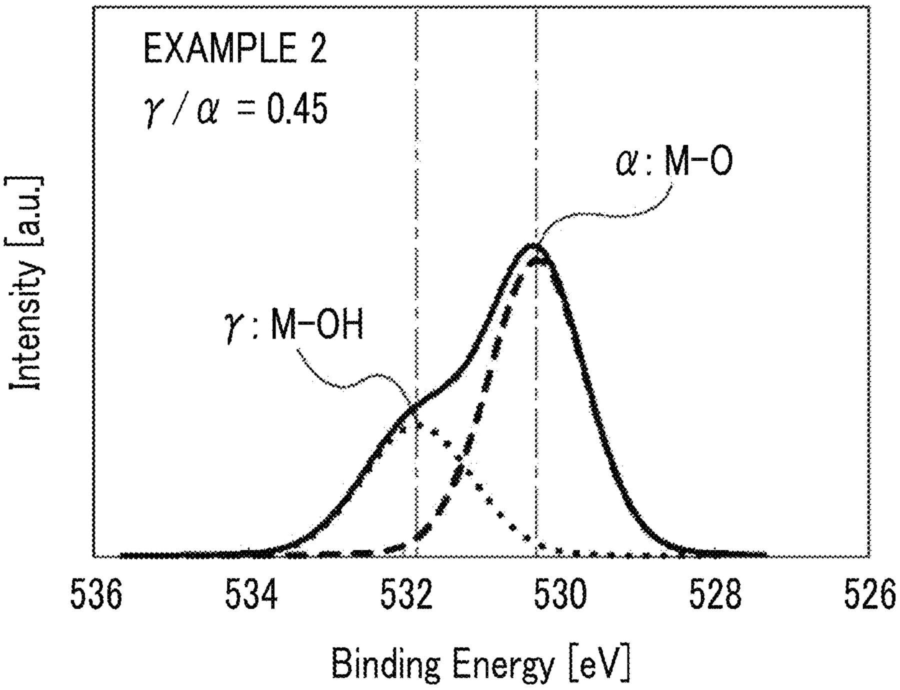
FIG. 7 is a view showing a binding energy profile for an interface layer of Example 2.
Figure 8:
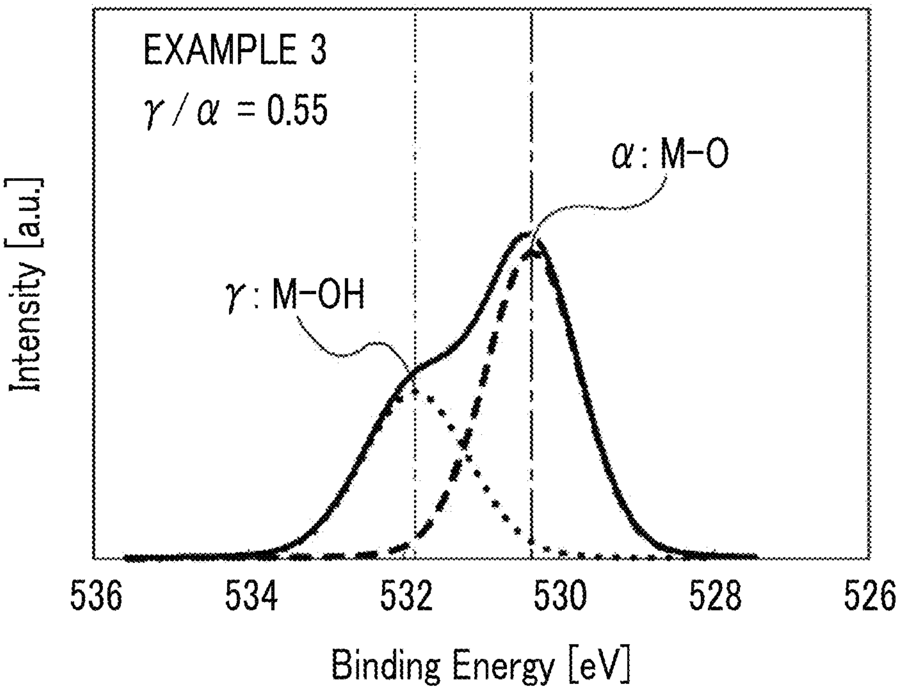
FIG. 8 is a view showing a binding energy profile for an interface layer of Example 3.
Figure 9:
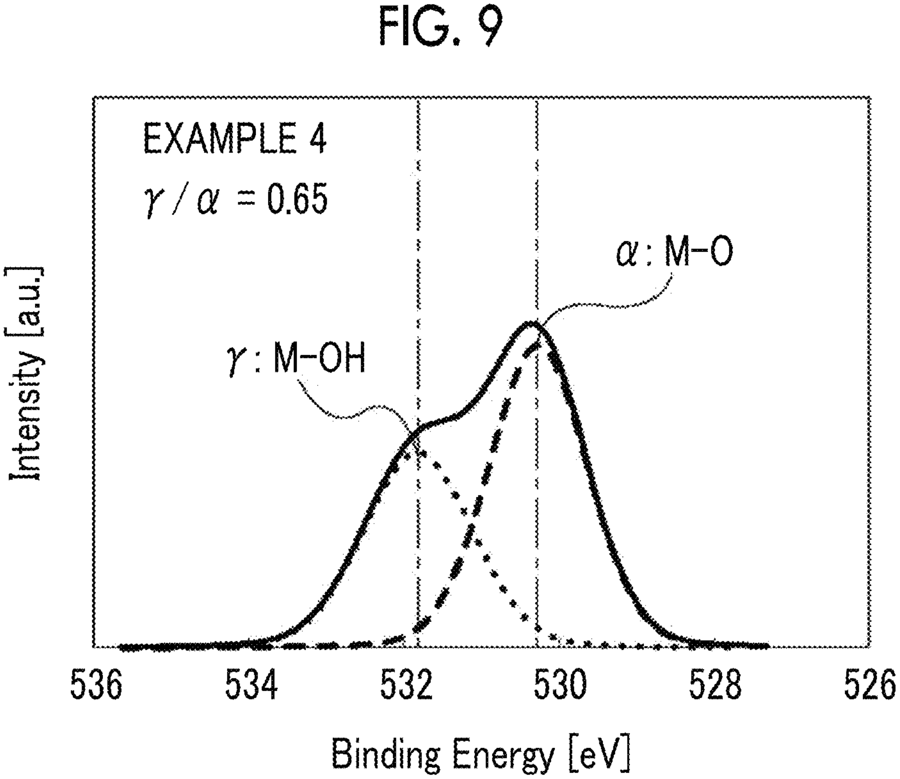
FIG. 9 is a view showing a binding energy profile for an interface layer of Example 4.
Figure 10:
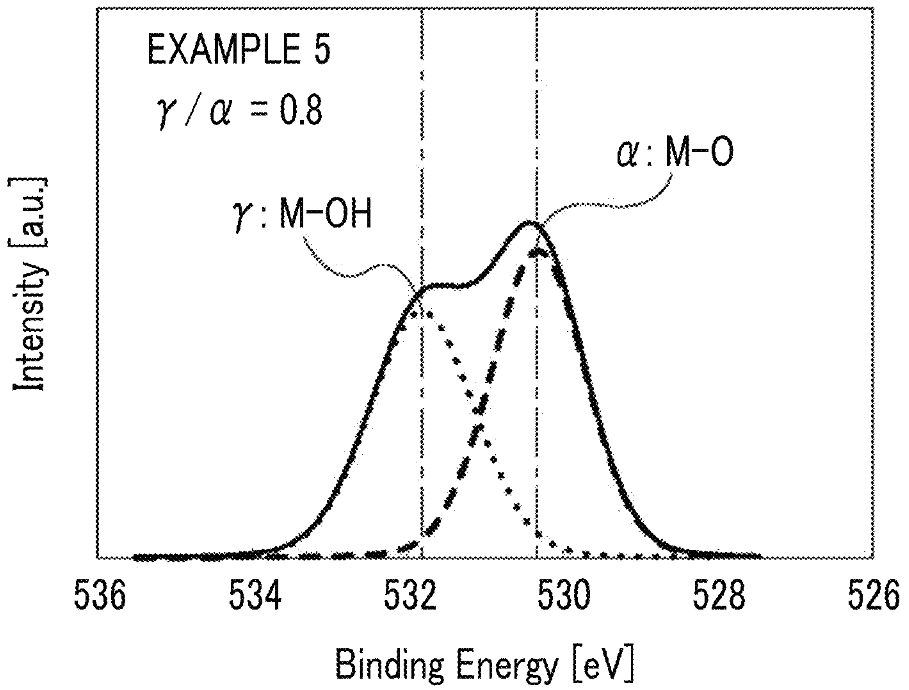
FIG. 10 is a view showing a binding energy profile for an interface layer of Example 5.

FIGS. 5A and 5B are explanatory views of a production method for a sample for the photoelectron spectroscopy measurement. FIG. 5A is a schematic cross-sectional view of a part of a piezoelectric element, and FIG. 5B is a schematic view of a cut surface of a measurement sample obtained from the piezoelectric element shown in FIG. 5A.

A sample for composition analysis was produced for the piezoelectric element of each of Examples and Comparative Examples by using an oblique cutting method. As shown in FIG. 5A, a diamond knife was inserted into the surface of the piezoelectric element at an angle θ, and the piezoelectric element was cut obliquely. As a result, such a cut surface as shown in FIG. 5B was obtained. As shown in FIG. 5B, on the cut surface, the interface layer 16 having a thickness t shown in FIG. 5A is exposed with a width of 1/sin θ times. It is noted that the thickness t of the interface layer 16 was estimated to be about 10 nm, and the angle θ was set such that the width of the interface layer 16 exposed to the cut surface after oblique excavation was 5 μm or more.

A measurement area (an area surrounded by a circle in FIG. 5B) was set such that the piezoelectric film 15 was slightly included in the cut surface obtained as described above and subjected to the photoelectron spectroscopy measurement.

FIG. 6 to FIG. 10 are intensity profiles of binding energy, which are acquired by the photoelectron spectroscopy measurement of the piezoelectric elements of Examples 1 to 5. In FIG. 6 to FIG. 10, the intensity profile indicated by the solid line is the measurement data in a state where noise has been removed. All of Examples 1 to 5 are examples in a case where the oxide conductive layer constituting the upper electrode layer is ITO. A spectrum derived from the 1s orbital of oxygen appears in the vicinity of a binding energy of 530 eV shown in FIG. 6 to FIG. 10. As shown in FIG. 6 to FIG. 10, the spectrum derived from the 1s orbital of oxygen has two maximal values. Peak separation was carried out to obtain two peaks each having a peak value at the binding energy at which each of the two maximal values was exhibited. As described above, the peak indicated by the broken line in FIG. 6 to FIG. 10 is the peak of the binding energy caused by the 1s orbital of the oxygen O bonded to the metal M (hereinafter, referred to as "the oxygen O in the M-O bond"). In FIG. 6 to FIG. 10, among the two separated peaks, the peak on the high energy side indicated by the dotted line is the peak of the binding energy caused by the 1s orbital O of the OH group bonded to the metal M (hereinafter, referred to as "the oxygen O in the M-OH bond"). Each of the peak intensities α and γ was determined, and the peak intensity ratio γ/α was calculated.

It is noted that although the intensity profiles for Examples 1 to 5 are respectively shown in FIG. 6 to FIG. 10, the intensity profile of the binding energy was acquired by the same procedure for all Examples and Comparative Examples, and the peak intensity ratio γ/α was calculated from the intensity profile. This peak intensity ratio corresponds to the abundance of the M-OH bond with respect to the abundance of the M-O bond and serves as a guide for the evaluation of the OH content in the interface layer. The peak intensity ratio in each example is shown in Table 1 below.

It is noted that in the peak separation, the database of the National Institute of Standards and Technology (NIST) ([online], [searched on Mar. 23, 2021], and the Internet, <URL: https://srdata.nist.gov/xps/main search_menu.aspx>, were referenced for the binding energy of the M-O bond and the binding energy of the M-OH bond. However, since a spectrum may occur depending on the measuring device, each binding energy was set from the maximal value of the acquired spectrum after the numerical values in the above database were referenced, and then the peak separation was carried out.

<Measurement of Withstand Voltage>

Figure 3:
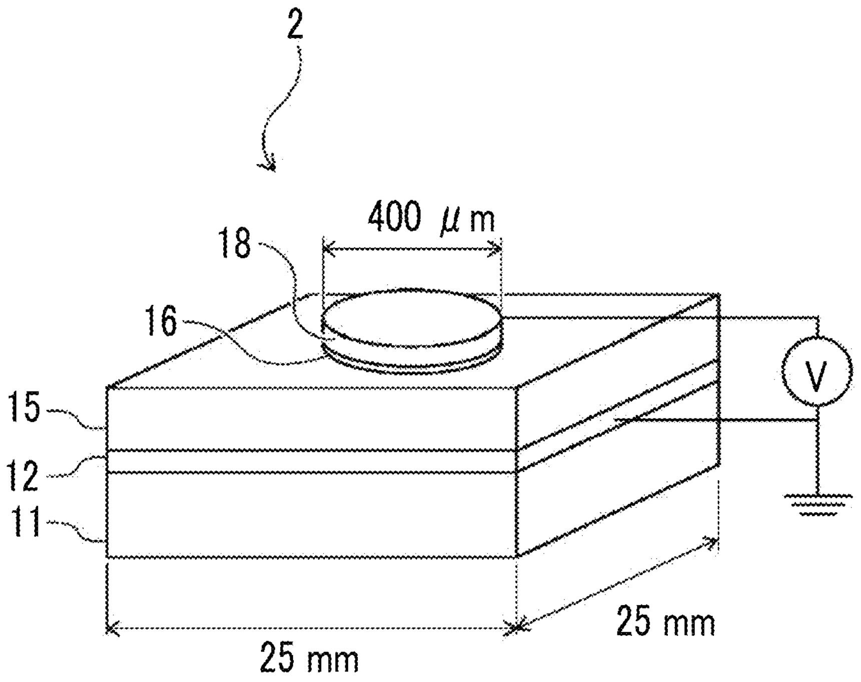
FIG. 3 is a view showing a schematic configuration of an evaluation sample.

For Examples and Comparative Examples, the withstand voltage of the piezoelectric element was measured using an evaluation sample 2 shown in FIG. 3. The evaluation sample 2 was produced by using a metal mask having an opening having a diameter of 400 μm at the time of forming the upper electrode layer in the above-described manufacturing method. The upper electrode layer 18, which was circular-shaped and had a diameter of 400 μm, was formed by carrying out a sputter film formation through a metal mask. Further, one piece was cut out to a size of 25 mm×25 mm with the upper electrode layer 18 as a center to produce the evaluation sample 2 shown in FIG. 3. The lower electrode layer 12 was grounded, a voltage was gradually raised as a negative potential with respect to the upper electrode layer 18 at a rate of change of −1 V/sec, and a voltage at which a current of 1 mA or more flowed was regarded as the dielectric breakdown voltage. A total of 10 measurements were carried out, and an average value (in terms of absolute value) therefrom was defined as a withstand voltage. The measurement results are shown in Table 1. It is noted that the upper limit of the voltage was set to 300 V, and a case where the dielectric breakdown did not occur up to 300 V, was described as ">300" in Table 1.

<Measurement of Electrical Characteristics>

The bipolar polarization-electric field characteristics (P-E hysteresis characteristics) of the piezoelectric element were measured. Using the same evaluation sample 2 as the sample used for the withstand voltage measurement, the measurement was carried out by setting the maximum applied voltage to 80 V (that is, the maximum applied electric field of 400 kV/cm) under the condition of a frequency of 10 Hz. The spontaneous polarization P was determined from the acquired P-E hysteresis curve. Table 1 shows the spontaneous polarization of each of Examples and Comparative Examples. It is noted that the larger spontaneous polarization P means the larger piezoelectric constant and the higher the piezoelectric characteristics are obtained.

<Evaluation of Drive Stability>

A time dependent dielectric breakdown (TDDB) test was carried out for the evaluation of drive stability. Using the same evaluation sample 2 as the sample used for the withstand voltage measurement, in an environment of 150° C., the lower electrode layer 12 was grounded, a voltage of −30 V was applied to the upper electrode layer 18, and the time (hr) taken from the start of the voltage application to the occurrence of dielectric breakdown was measured. The measurement results are shown in Table 1. It is noted that the TDDB test was carried out for 100 hours, and a case where the dielectric breakdown did not occur for 100 hours and the time taken until the dielectric breakdown occurred exceeded 100 hours was described as ">100" in Table 1.

<Measurement of Surface Unevenness of Piezoelectric Film>

Surface unevenness was measured in a dynamic force mode (DFM) using an S-image type scanning probe microscope (SPM) manufactured by Hitachi High-Tech Science Corporation. The surface unevenness was measured within a range of 5 $\mu m^2$ on the surface of the piezoelectric film 15 where the circular upper electrode layer 18 was not formed and was exposed. Table 1 shows peak to valley (PV value), which is the maximum unevenness difference on the surface.

TABLE 1

| | Upper electrode material | Back pressure [Pa] | Condition in film formation of upper electrode layer | Thickness of interface layer [nm] | γ/α γ: M—OH α: M—O | Withstand voltage [V] | Spontaneous polarization P [C/m²] | Drive stability [h] | Surface unevenness [nm] |
|---|---|---|---|---|---|---|---|---|---|
| Example 1 | ITO | $5 \times 10^{-4}$ | — | 2 | 0.35 | 120 | 40 | 65 | 80 |
| Example 2 | ITO | $5 \times 10^{-3}$ | — | 2 | 0.45 | 150 | 40 | 80 | 80 |
| Example 3 | ITO | $1 \times 10^{-2}$ | — | 3 | 0.55 | 180 | 40 | >100 | 80 |
| Example 4 | ITO | $5 \times 10^{-2}$ | — | 3 | 0.65 | 210 | 40 | >100 | 80 |
| Example 5 | ITO | $5 \times 10^{-2}$ | $H_2O$ gas (10 seconds) | 4 | 0.8 | 250 | 40 | >100 | 80 |
| Example 6 | ITO | $5 \times 10^{-2}$ | $H_2O$ gas (10 seconds) | 5 | 0.8 | 180 | 40 | >100 | 150 |
| Example 7 | ITO | $5 \times 10^{-2}$ | $H_2O$ gas (20 scconds) | 5 | 0.8 | >300 | 40 | >100 | 80 |
| Example 8 | $IrO_2$ | $5 \times 10^{-3}$ | — | 2 | 0.4 | 140 | 40 | 70 | 80 |
| Example 9 | $IrO_2$ | $5 \times 10^{-2}$ | $H_2O$ gas (10 seconds) | 5 | 0.65 | 200 | 40 | >100 | 80 |
| Example 10 | $SrRuO_3$ | $5 \times 10^{-3}$ | — | 3 | 0.35 | 150 | 40 | 90 | 80 |
| Example 11 | $SrRuO_3$ | $5 \times 10^{-2}$ | $H_2O$ gas (10 seconds) | 5 | 0.7 | 220 | 40 | >100 | 80 |
| Comparative Example 1 | ITO | $2 \times 10^{-4}$ | — | Less than 2 | 0.33 | 90 | 40 | 40 | 80 |
| Comparative Example 2 | ITO | $2 \times 10^{-4}$ | Film formation under heating | Less than 1 | 0.3 | 85 | 40 | 15 | 80 |
| Comparative Example 3 | $IrO_2$ | $2 \times 10^{-4}$ | Film formation under heating | Less than 1 | 0.3 | 65 | 40 | 10 | 80 |
| Comparative Example 4 | ITO | $5 \times 10^{-2}$ | $H_2O$ gas (30 seconds) | 10 | 0.8 | >300 | 32 | >100 | 80 |

As shown in Table 1, it is revealed that in Examples 1 to 11 in which the interface layer has a thickness of 1 to 5 nm and is provided between the piezoelectric film and the oxide conductive layer which is the upper electrode layer, and $0.35 \leq \gamma/\alpha$ is satisfied, the withstand voltage and the drive stability are dramatically improved as compared with Comparative Examples 1 to 3 in which $\gamma/\alpha$ is 0.3 to 0.33. In Examples 1 to 11, the withstand voltage was as high as 120 V or more, and the drive stability was also extended by at least 1.5 times or more with respect to 40 hours (Comparative Example 1) in the related art. In addition, in Examples 1 to 11, the spontaneous polarization P was equivalent to that in Comparative Example 1. That is, in the piezoelectric elements of Examples 1 to 11, the piezoelectric characteristics could be maintained while improving the withstand voltage and the drive stability. According to Examples 1 to 5, it can be seen that the higher the content of the OH group in the interface layer, that is, the larger the $\gamma/\alpha$ in a range of $0.35 \leq \gamma/\alpha \leq 0.8$, the higher the withstand voltage can be realized. In addition, in a case of $0.55 \leq \gamma/\alpha \leq 0.8$, the drive stability exceeded 100 hours, and thus very high reliability was obtained. Although the upper electrode layer is an ITO layer in all of Examples 1 to 5, the same tendency is observed even in a case where the upper electrode layer of each of Examples 8 and 9 is an $IrO_2$ layer and even in a case where the upper electrode layer of each of Examples 10 and 11 is an $SrRuO_3$ layer. From the comparison between Examples 5 and 6, such a result that the smaller the surface unevenness, the better the withstand voltage has been obtained.

On the other hand, it was found that in a case where the thickness of the interface layer is as thick as 10 nm as in Comparative Example 4, the withstand voltage and the drive stability can be improved, whereas the piezoelectric characteristics are deteriorated.

From the results of Examples 1 to 4, Comparative Example 1, and the like, it is revealed that in a case of adjusting the back pressure of the film forming chamber before the sputtering step at the time of forming a film of the upper electrode layer, it is possible to adjust the OH group to be contained in the interface layer. In addition, in a case of introducing the $H_2O$ gas in the initial stage of film formation in the sputtering step, it is possible to more effectively increase the quantity of the OH group to be contained in the interface layer.

The disclosure of JP2021-058185 filed on Mar. 30, 2021 is incorporated in the present specification by reference in its entirety.

All documents, patent applications, and technical standards described in the present specification are incorporated herein by reference, to the same extent as in the case where each of the documents, patent applications, and technical standards is specifically and individually described.

What is claimed is:

1. A piezoelectric element comprising, on a substrate in the following order:

a lower electrode layer;

a piezoelectric film containing a perovskite-type oxide as a main component; and an upper electrode layer, wherein at least a region of the upper electrode layer closest to a side of the piezoelectric film is composed of an oxide conductive layer, an interface layer containing a constituent element of the oxide conductive layer and an OH group is provided between the piezoelectric film and the oxide conductive layer of the upper electrode layer, the interface layer has an amorphous structure and has a thickness of 1 nm or more and 5 nm or less, and in an intensity profile of binding energy in the interface layer, which is acquired by an X-ray photoelectron spectroscopy measurement, in a case where a peak intensity of binding energy derived from a 1s orbital of oxygen bonded to a metal is defined as α, and a peak intensity of binding energy derived from a 1s orbital of oxygen constituting the OH group is defined as γ, a peak intensity ratio $\gamma/\alpha$ satisfies Expression (1), $$0.35 \leq \gamma/\alpha \quad (1).$$

2. The piezoelectric element according to claim 1, wherein the oxide conductive layer is a layer containing ITO, $IrO_2$, or $SrRuO_3$ as a main component.

3. The piezoelectric element according to claim 1, wherein in the intensity profile of the binding energy, the peak intensity ratio $\gamma/\alpha$ satisfies Expression (2), $$0.55 \leq \gamma/\alpha \quad (2).$$

4. The piezoelectric element according to claim 1, wherein the interface layer has a thickness of 3 nm or more and 5 nm or less.

5. The piezoelectric element according to claim 1, wherein a height difference of a surface unevenness of the piezoelectric film is 100 nm or less.

6. The piezoelectric element according to claim 1, wherein the perovskite-type oxide contains Pb, Zr, Ti, and O.

7. The piezoelectric element according to claim 6, wherein the perovskite-type oxide is a compound represented by General Formula (3), $$Pb\{(Zr_xTi_{1-x})_{y-1}B1_y\}O_3 \quad (3)$$

0<x<1, 0<y<0.3,

B1 is one or more elements selected from V, Nb, Ta, Sb, Mo, and W.

8. The piezoelectric element according to claim 1, wherein the piezoelectric film has a columnar structure consisting of a large number of columnar crystals.

9. The piezoelectric element according to claim 8, wherein a (100) or (001) plane of the columnar crystal has an inclination of 1° or more with respect to a surface of the substrate.

10. A manufacturing method for a piezoelectric element, which is a manufacturing method for the piezoelectric element according to claim 1, the manufacturing method comprising:

a sputtering step of forming a film of the oxide conductive layer on the piezoelectric film of a laminate including the lower electrode layer and the piezoelectric film on the substrate, wherein in an initial stage of the film formation in the sputtering step, sputtering is carried out, while introducing an $H_2O$ gas into a film forming chamber of a film forming device, to form the interface layer, and subsequently, sputtering is carried out in a state where the introduction of the $H_2O$ gas is stopped, to form the film of the oxide conductive layer.

11. A manufacturing method for a piezoelectric element, which is a manufacturing method for the piezoelectric element according to claim 1, the manufacturing method comprising:

a sputtering step of forming a film of the oxide conductive layer on the piezoelectric film of a laminate including the lower electrode layer and the piezoelectric film on the substrate, wherein before carrying out the sputtering step, vacuuming is carried out until a back pressure in a film forming chamber of a film forming device reaches $5\times10^{-3}$ Pa or more and $5\times10^{-2}$ Pa or less, and after the back pressure is reached, a film forming gas is introduced to carry out the sputtering step.

* * * * *